(12) United States Patent
Zare-Hoseini et al.

(10) Patent No.: US 7,561,089 B2
(45) Date of Patent: Jul. 14, 2009

(54) DIGITAL TO ANALOGUE CONVERSION

(75) Inventors: Hashem Zare-Hoseini, Cambridge (GB); Izzet Kale, Mitcham (GB); Richard Charles Spicer Morling, London (GB)

(73) Assignee: University of Westminster (GB)

( * ) Notice: Subject to any disclaimer, the term of this patent is extended or adjusted under 35 U.S.C. 154(b) by 0 days.

(21) Appl. No.: 11/793,583

(22) PCT Filed: Dec. 14, 2005

(86) PCT No.: PCT/GB2005/004832

§ 371 (c)(1),
(2), (4) Date: Dec. 13, 2007

(87) PCT Pub. No.: WO2006/067382

PCT Pub. Date: Jun. 29, 2006

(65) Prior Publication Data

US 2008/0106447 A1    May 8, 2008

(30) Foreign Application Priority Data

Dec. 22, 2004 (GB) .................................. 0428114

(51) Int. Cl.
    *H03M 1/66* (2006.01)
(52) U.S. Cl. ....................................... 341/150; 341/144
(58) Field of Classification Search ................ 341/144, 341/150, 145, 154, 135
    See application file for complete search history.

(56) References Cited

U.S. PATENT DOCUMENTS 3,654,487 A * 4/1972 Okamoto et al. ............. 341/144
4,184,152 A * 1/1980 Mukawa ...................... 341/108
4,291,297 A * 9/1981 Kanemaru et al. ........... 341/169

(Continued)

FOREIGN PATENT DOCUMENTS

EP          1 147 609         7/2006

(Continued)

OTHER PUBLICATIONS

International Search Report for corresponding PCT/GB2005/004832 dated Mar. 21, 2006.

(Continued)

*Primary Examiner*—Brian Young
(74) *Attorney, Agent, or Firm*—Ohlandt, Greeley, Ruggiero and Perle, L.L.P.

(57) ABSTRACT

A method of Digital to Analogue conversion of an input signal $D_o$ for suppressing the effect of clock-jitter in a Delta-Sigma analogue to digital converter, or class D amplifier, comprises charging a capacitor to a reference voltage value ($V_{ref}$) during a first phase ($\phi$) of a clock signal, discharging the capacitor during a second phase ($\phi_2$) of the clock signal, wherein the discharge is regulated by a biased transistor, responsive to the voltage on the capacitor, in a first part of the second phase to provide an approximately constant discharge current, and regulated in a second part of the second phase for rapidly discharging the capacitor before the end of the second phase; and providing an output ($U_d$, OUT) as a function of the discharge current and the input signal $D_o$. The output signal $U_d$ may be applied as a feedback signal to a loop filter in a Delta-Sigma converter. Alternatively, the output may represent the output of a Class D amplifier.

10 Claims, 4 Drawing Sheets

U.S. PATENT DOCUMENTS

| | | | |
|---|---|---|---|
| 6,184,812 B1 | 2/2001 | Younis et al. | 341/143 |
| 6,337,647 B1 * | 1/2002 | Masson et al. | 341/150 |

FOREIGN PATENT DOCUMENTS

| | | |
|---|---|---|
| JP | 05-075468 | 3/1993 |
| JP | 2005075468 | 3/2005 |
| WO | 2004/034588 A1 | 4/2004 |

OTHER PUBLICATIONS

Schreier et al.; "*Delta-Sigma Modulator employing Continuous-Time Circuitry*"; IEEE Transaction on Circuits and Systems-I; vol. 43, No. 4; pp. 324-332; Apr. 1996.

Shoaei et al.; "*Optimal (bandpass) Continuous-Time Sigma-Delta Modulator*"; IEEE International Symposium on Circuits and Systems; vol. 5, pp. 486-492; Jun. 1994.

Robert H.M. van Veldhoven; "*A Triple-Mode Continuous-Time Sigma-Delta Modulator with Switched-Capacitor Feedback DAC for a GSM-EDGE/CDMA200/UMTS Receiver*"; IEEE Journal of Solid-State Circuits; vol. 38 No. 12; pp. 2069-2076; Dec. 2003.

* cited by examiner

-PRIOR ART-

-PRIOR ART-

DIGITAL TO ANALOGUE CONVERSION

FIELD OF THE INVENTION

This invention relates generally to circuits and processes for digital to analogue conversion. The present invention has particular application to Delta-Sigma converters and to class D amplifiers.

BACKGROUND OF THE INVENTION

Delta Sigma (DS) Analogue to Digital Converters (ADCs) and Digital to Analogue Converters (DACs) have become very popular converters for high-resolution applications because of their oversampling and noise shaping nature. These characteristics make them more robust to their components' nonlinearities and nonidealities. Indeed, by trading accuracy with speed, DS converters have become more attractive in the context of present CMOS technology evolution.

DS converters can be realized in either Switched-Capacitor (SC) or Continuous-Time (CT) approach. Nowadays, SC modulators (converters) are widely used in commercial applications as they can be more efficiently realized in the standard CMOS technology and provide a highly controllable design as well as being highly insensitive to clock jitter problems. Indeed, SC modulators are theoretically well understood and studied. However, SC realizations suffer from some problems. One of the biggest drawbacks of them is their relatively high power-consumption which arises from their nature, namely that of a switching capacitor. The other main problem of SC DS converters is their relatively low-speed nature arising from the fact that the required bandwidth for their op-amps is at least more than five times bigger than the sampling frequency. Also, a SC converter needs an anti-aliasing filter at the input of the modulator to prevent aliasing.

Referring to FIG. 1, a general scheme of a CT DS modulator (converter) is shown comprising a loop-filter 111, an n-bit ADC 112 (also called an n-bit quantizer) and an n-bit DAC 113. ADC 112 and DAC 113 are clocked; the sampling operation of the converter is performed at the input to ADC 112. In contrast to SC DS converters, CT DS converters perform the sampling operation inside the modulator-loop and so shape the sampling error to be out of the bound of interest. Hence, the bandwidth requirements of the op-amps in the converter are reduced. Moreover, as there is no switching inside the loop-filter, the power consumption of the op-amps and the integrators are substantially decreased. These characteristics make CT DS converters more suitable for high-speed applications. CT DS converters are described for example in Schreier, and B. Zhang, "Delta-Sigma Modulators employing Continuous-Time Circuitry," IEEE Transaction on Circuits and Systems—I, Vol. 43, No. 4, pp. 324-332, April 1996; O. Shoaei, and M. Snelgrove, "Optimal (bandpass) Continuous-Time Sigma-Delta Modulator," IEEE International Symposium on Circuits and Systems, Vol. 5, pp. 489-492, June 1994; and Robert H. M. van Veldhoven, "A Triple-Mode Continuous-Time Sigma-Delta Modulator With Switched-Capacitor Feedback DAC for a GSM-EDGE/CDMA200/UMTS Receiver," IEEE Journal of Solid-State Circuits, Vol. 38, No. 12, pp. 2069-2076, December 2003.

Besides the advantages of CT circuitry with respect to their higher bandwidth and/or lower power-dissipation, there are some limitations in achieving high Signal-to-Noise-plus-Distortion ratio (SNDR) from them. The asymmetry of falling and rising edges of the feedback signal, sensitivity to feedback-delay and susceptibility to clock jitter are the biggest obstacles in designing CT DS modulators. Yet, the first two problems have been studied well and some robust techniques and solutions have been proposed to resolve them.

Clock-jitter predominantly affects SC DS modulators only at the sampling time of the input signal and hence because of the oversampling nature of the modulator its effect is attenuated in the band of interest at the modulator's output by the factor of the OverSampling Ratio (OSR). However, in CT DS modulators, clock jitter changes the feedback value by altering the signal pulse-width of the feedback coming to the loop-filter. Approximately, clock jitter in CT DS modulators has in the order of the square of the OSR worse effect than in SC DS modulators and is a severe problem in designing CT DS modulators.

This problem has been addressed in EP-A-1147609, which is described below with reference to FIGS. 2 and 3. In EP-A-1147609, the DAC 113 of FIG. 1 is replaced by a capacitor that is charged to different reference voltages, depending on the value of the digital signal, and then discharged through a passive or active resistor. Nevertheless further improvements are desirable, particularly in reducing power consumption.

WO2004/034588 discloses circuits for reducing clock jitter in a CT DS modulator, wherein, for digital to analog conversion, a control voltage is generated by discharging capacitor until the voltage on the capacitor reaches a level determined by a comparator. Problems with this arrangement include excessive power requirements, caused by the waveform of the capacitor, and clock jitter and circuit complexity caused by use of a comparator.

Class D Amplifiers are also very susceptible to clock jitter (and also power supply variations) because they involve large signal transitions. This is similar to the problem of the feedback DAC in CT DS converters. Suppressing clock jitter is therefore also desired in class D amplifiers to maintain accuracy. Class D amplifiers frequently have the load coupled in an H-bridge configuration, where the load output is switched between two reference voltage levels. H-bridges are widely used in hearing-aid devices because of their low-power, low-voltage compatibility. Using one battery cell, the output of the amplifier is switched between the ground and power supply rails. Clock jitter causes an additional noise floor on the output signal as it changes the duration of on and off switches. Also, switching the output load causes variations on the two rails and therefore decreases the dynamic range and precision of the amplifier.

Therefore, a need exists to have improved techniques for suppressing clock-jitter in CT DS modulators and also in class D amplifiers.

SUMMARY OF THE INVENTION

The present invention addresses the need for suppression or reduction of the effect of clock-jitter in CT DS modulators and class D amplifiers.

The present invention provides in a first general aspect, an apparatus for a digital to analogue conversion of an input signal ($D_o$) to an output signal ($U_d$, OUT) including:

capacitance means (414) coupled to a switch means (412, 413) for charging the capacitance means to a reference voltage value ($V_{ref}$) during a first phase ($\phi_1$) of a clock signal, and for discharging the capacitance means through a discharge means during a second phase ($\phi_2$) of the clock signal, said discharge means (415-420) providing a discharge path regulating the discharge of the capacitance means, including discharge transistor means, and said discharge means being responsive to the discharge of the capacitance means whereby the discharge transistor means is biassed into a mode in said second phase for providing an approximately constant discharge current, and is subsequently biassed into a low impedance mode for rapidly discharging the capacitance means before the end of the second phase; and output means coupled to the discharge means for producing said output signal ($U_d$, OUT) as a function of the discharge current and the input signal $D_o$.

As preferred the transistor means is biased into a saturation mode for providing a constant discharge current, in which case the degree of variation from a constant value will be determined by the characteristics of the saturation mode. The low impedance mode of the transistor means is desirably what is usually known as the triode region of the operating characteristics.

In the case where the apparatus of the invention is incorporated in a digital to analog converter in a CTDS modulator, the output means may a switched current block, or other means for providing an appropriate signal to a loop filter.

In the case where the apparatus of the invention is employed in combination with a class D amplifier, the output means may be a Class D amplifier, or a means providing a class D amplifier function In a second general aspect, the invention provides a method for digital to analogue conversion of an input signal $D_o$ to an output signal ($U_d$, OUT), comprising:

providing a clock signal having a first phase ($\phi_1$) and a second phase ($\phi_2$), and providing a capacitance means;

charging said capacitance means to a reference voltage value ($V_{ref}$) during said first phase, discharging said capacitance means during said second phase, wherein the discharge is regulated in a first part of the second phase to provide an approximately constant discharge current, and regulated in a second part of the second phase for rapidly discharging the capacitance means before the end of the second phase; and providing said output signal ($U_d$, OUT) as a function of the discharge current and the input signal $D_o$.

In accordance with a first specific aspect of the present invention, a method for CT DS modulation of an input signal $U_i$ includes: receiving the input signal $U_i$ and a feedback signal $U_d$ by a continuous-time loop-filter and producing an analogue signal $U_f$, sampling and quantizing the loop-filter's output signal $U_f$ to produce a DS modulated signal $D_o$, converting the signal $D_o$ to the analogue signal $U_d$ that includes:

a) charging a capacitor to a single analogue reference signal during the first phase of the clock signal (the capacitor should be fully charged during the first phase), b) discharging the capacitor through a transistor during the second phase of the clock signal. The transistor is biased to have a desired current $I_{ref1}$ during its saturation mode, c) generating current or voltage sources as a function of the current $I_{ref1}$ of the transistor, d) producing the analogue output $U_d$ as a function of the current or the voltage sources and the DS modulated signal $D_o$ and feeding it to the loop-filter as the modulation feedback, In accordance with a specific second aspect of the present invention, a method for a digital to analogue conversion of a signal $D_o$ includes:

a) charging a capacitor to a single analogue reference signal during the first phase of the clock signal (the capacitor should be fully charged during the first phase), b) discharging the capacitor through a transistor during the second phase of the clock signal. The transistor is biased to have a desired current $I_{ref1}$ during its saturation mode, c) generating current or voltage sources as a function of the current $I_{ref1}$ of the transistor, d) producing an analogue output $U_d$ as a function of the current or the voltage sources and the input signal $D_o$ and feeding it to the loop-filter, In accordance with a specific third aspect of the present invention, an apparatus for CT DS modulation includes: a continuous-time loop-filter receiving an input signal $U_i$ and a feedback signal $U_d$ to produce an analogue signal $U_f$, a quantizer coupled to receive the loop-filter's output signal $U_f$ and produce a DS modulated signal $D_o$, a DAC which includes:

a) a capacitor which one of its two plates is preferably connected to the ground terminal, b) a switch coupled to the capacitor charging it to a single analogue reference signal during the first phase of the clock signal, c) a switch coupled to the capacitor discharging the capacitor through a transistor during the second phase of the clock signal. The transistor is biased to have a desired current $I_{ref1}$ during its saturation mode, d) current or voltage sources controlled as a function of the transistor current $I_{ref1}$, e) a block producing the analogue output $U_d$ as a function of the current or the voltage sources and the DS modulated signal $D_o$ and feeding it to the loop-filter as the modulation feedback, In accordance with a specific fourth aspect of the present invention, an apparatus for a digital to analogue conversion of an input signal $D_o$ includes:

a) a capacitor which one of its two plates is preferably connected to the ground terminal, b) a switch coupled to the capacitor charging it to a single analogue reference signal during the first phase of the clock signal, c) a switch coupled to the capacitor discharging the capacitor through a transistor during the second phase of the clock signal. The transistor is biased to have a desired current $I_{ref1}$ during its saturation mode, d) current or voltage sources controlled as a function of the transistor current $I_{ref1}$.

e) a block producing an analogue output $U_d$ as a function of the current or the voltage sources and the input signal $D_o$, In all of these four aspects, the size of the capacitor, the reference voltage, the switches and the transistors should be properly set to ensure that clock jitter has a minimal effect on the integral of the analogue output signal $U_d$ undertaken at the second phase.

In accordance with a specific fifth aspect of the present invention, a CT DS modulator is provided including, a continuous-time loop-filter receiving an input signal $U_i$ and a feedback signal $U_d$ to produce an analogue signal $U_f$, a quantizer coupled to receive the loop-filter's output signal $U_f$ and produce a DS modulated signal $D_o$, a DAC to produce the analogue signal $U_d$ which includes:

a) means for charging a capacitor to a single analogue reference during the first phase of the clock signal, b) means for discharging the capacitor to a biased-transistor during the second phase of the clock signal, c) means for generating current or voltage sources controlled as a function of the transistor current, d) means for producing the analogue output $U_d$ as a function of the current or the voltage sources and the DS modulated signal $D_o$ and feeding it to the loop-filter as the modulation feedback, in the way that ensures clock jitter has a minimal effect on the integral of the analogue output signal $U_d$ undertaken at the second phase.

In accordance with a sixth aspect of the present invention, a digital to analogue conversion of an input signal $D_o$ is provided including:
  a) means for charging a capacitor to a single analogue reference during the first phase of the clock signal,
  b) means for discharging the capacitor to a biased-transistor during the second phase of the clock signal,
  c) means for generating current or voltage sources controlled as a function of the transistor current $I_{refl}$,
  d) means for producing an analogue output $U_d$ as a function of the current or the voltage sources and the input signal $D_o$, in the way that ensures clock jitter has a minimal effect on the integral of the analogue output signal $U_d$ undertaken at the second phase.

In accordance with a specific seventh aspect of the present invention, a method for driving a class D amplifier (either single-ended or double-ended which its output is switched between two reference levels) of an input signal $D_o$ includes:
  a) charging a capacitor to a single analogue reference signal during the first phase of the clock signal (the capacitor should be fully charged during the first phase),
  b) discharging the capacitor through a transistor during the second phase of the clock signal. The transistor is biased to have a current $I_{refl}$ during its saturation mode where $I_{refl}$ is made directly proportional to the difference between the two output reference levels,
  c) coupling the class D amplifier to the system such that its output signal is a function of the current $I_{refl}$ and the input signal $D_o$.

In accordance with a specific eighth aspect of the present invention, an apparatus for driving a class D amplifier (either single-ended or double-ended which its output is switched between two reference levels) of an input signal $D_o$ includes:
  a) means for charging a capacitor to a single analogue reference during the first phase of the clock signal,
  b) means for discharging the capacitor to a biased-transistor during the second phase of the clock signal wherein the biased-transistor's current is made directly proportional to the difference between the two output reference levels,
  c) means for producing an output signal of the coupled class D amplifier as a function of the biased-transistor's current and the input signal $D_o$.

BRIEF DESCRIPTION OF THE DRAWINGS

Preferred embodiments of the invention will now be described with reference to the accompanying drawings, wherein.

DESCRIPTION OF THE PREFERRED EMBODIMENTS

Figure 1:
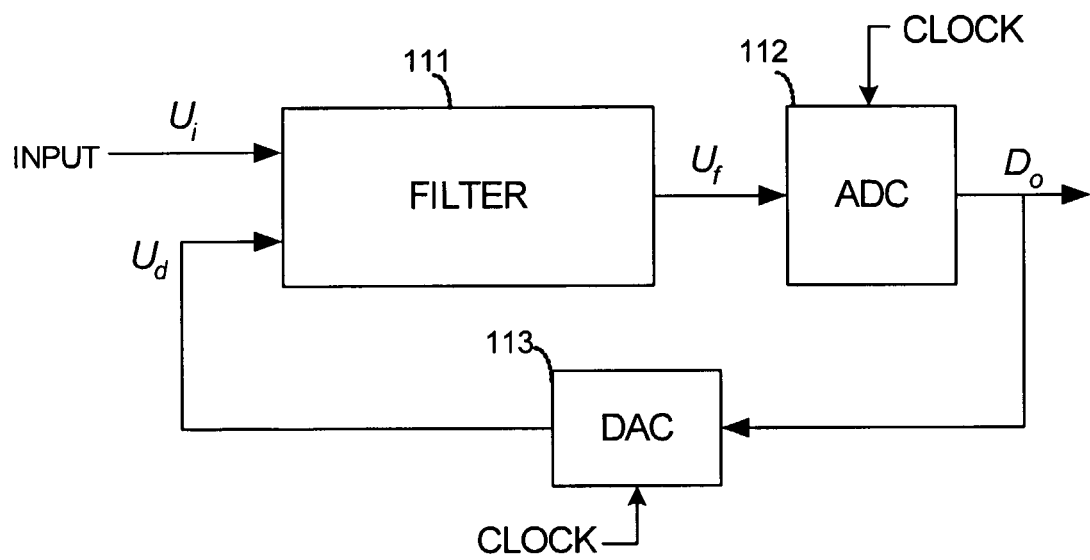
FIG. 1 shows a prior art CT delta-sigma modulator.
Figure 2:
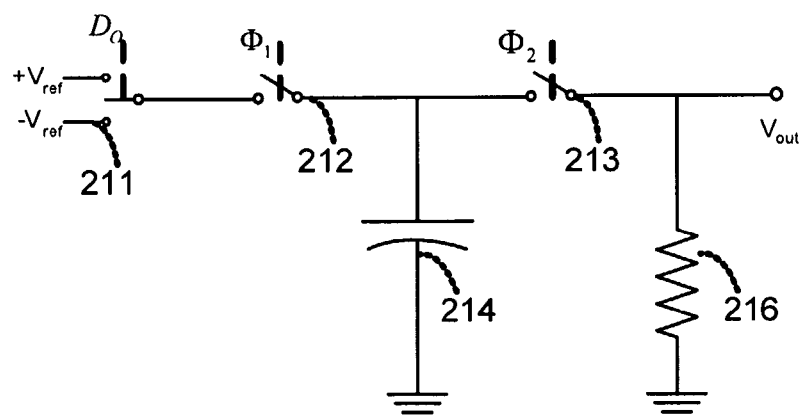
FIG. 2 shows a prior art technique for suppressing the clock-jitter in continuous-time delta-sigma modulators.

There is a penalty to pay when deploying a technique to suppress clock-jitter in CT DS modulators. This is, most probably, in the way of some extra power consumption not only in the apparatus circuits but also in the loop-filter of the modulator. Therefore there is a tradeoff between the extra power consumption and the suppression of clock-jitter. In EP-A-1147609 a technique has been proposed to suppress the sensitivity of CT DS modulators to clock jitter. One of the embodiments of this technique which is a replacement of DAC 113 in FIG. 1 is shown in FIG. 2. In this method, the sampling clock has two clock phases $\Phi_1$ and $\Phi_2$. During the first phase ($\Phi_1$), a capacitor 214 is charged to one of the two reference voltages (either $+V_{ref}$ or $-V_{ref}$) depending on the digital output of the modulator, $D_o$. During the second phase ($\Phi_2$), the capacitor 214 discharges to a resistor 216. The capacitor should be essentially fully charged before the end of the first phase ($\Phi_1$) and essentially fully discharged before the end of the second phase ($\Phi_2$). Having this, the mentioned technique reduces the clock-jitter sensitivity of the modulator, since the integral of the DAC's output voltage undertaken at the second phase ($\Phi_2$) is highly independent of the clock transition times.

Although this technique suppresses the clock-jitter noise at the output of the modulator, it has some drawbacks. The main problem of this architecture is the increase in the power consumption of the integrator which it feeds. It is essential that the integral of the analogue feedback signal undertaken in each clock period is the same as the integral of the one in the ordinary CT counterpart (for example the switched-current feedback). Hence, due to the exponential shape of the analogue feedback of this technique, and considering the pulsing shape of the switched-current feedback, it can be easily seen by those skilled in the art that the peak of the current feeding to the integrator by the feedback in this technique is much bigger that the one in the switched-current feedback. This phenomenon is demonstrated in FIG. 3 wherein the current shape in this technique (312) with the peak of $I_p$ is compared to the current shape of a typical switched-current feedback (311) with the amplitude of $I_r$. For instance, if at the end of the second phase ($\Phi_2$), the feeding current is around one percent of the one in switched-current 311 ($I_r$), the peak of the current in this technique ($I_p$) is more than six times bigger than the one in the switched-current 311 ($I_r$). Indeed, this technique uses the SC feedback and requires an integrator with a higher slew-rate and bandwidth than in ordinary CT feedback.

Therefore, a need still exists for a technique for suppressing the clock-jitter in CT DS modulators that is more power efficient.

The present invention, benefits from the behavior of a biased-transistor in the saturation and triode regions. For example, in CMOS technology, in the saturation region of a transistor, regardless of the drain-to-source voltage, the drain-to-source current is almost constant. When the transistor goes to the triode region, it acts as a resistor and its drain-to-source voltage diminishes to zero. Therefore, if a capacitor is discharged through a biased-transistor, one can expect a current shape like a pulse with an exponential shape in its falling edge like the current shape 313 in FIG. 3. As a simple explanation of the present invention, first a constant amount of charge is stored in a capacitor and then it discharges through a biased-transistor. The output will therefore be a function of the transistor's current. The size of the transistors, capacitor, switches and reference voltages should be set properly to ensure that the output signal meets two criteria:

First, the output signal should fall to a low enough level before the end of the phase ($T_n$ in FIG. 3) to ensure that the clock transition time has a minimal effect on the output's integral. By meeting this criterion, the clock jitter effect in the CT DS modulator will be suppressed to a similar level in comparison to its SC counterpart.

Figure 3:
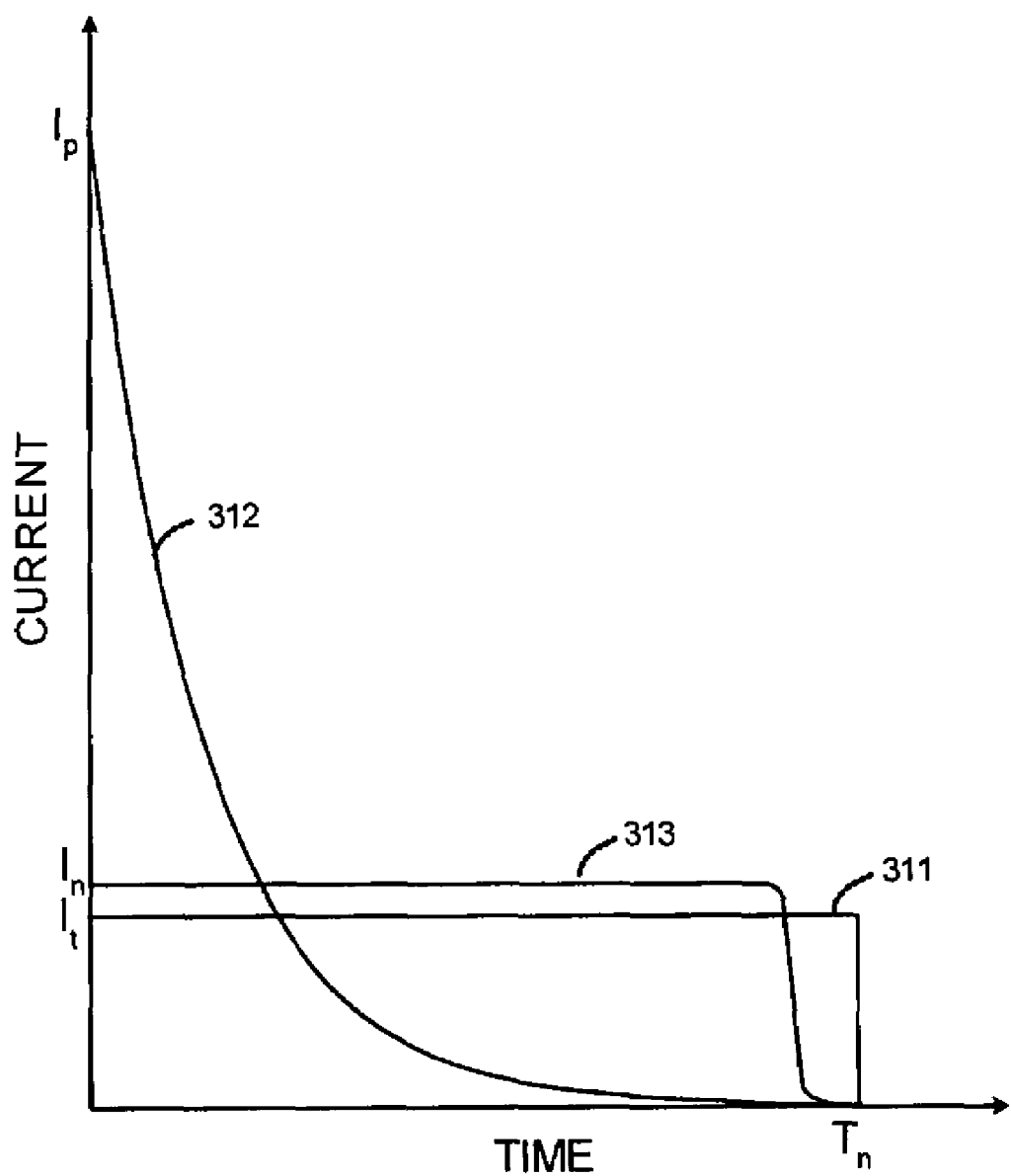
FIG. 3 is a graph comparing the output current of the a priori art switched-current feedback, a prior art technique of suppressing clock-jitter, and the present invention.

Second, the falling edge of the output signal should arrive just before (and not too early) the end of the phase ($T_n$ in FIG. 3). If the output signal goes down too early, although the clock jitter has a minimal effect on the integral of the output signal, the output signal's amplitude ($I_n$ in FIG. 3) should be increased to have the equivalent output signal's integral. The bigger the output signal, the more power consumption in the modulator.

Such a technique can be used to drive a class D amplifier (either single-ended or double-ended) which suffers from clock jitter and output-rails variations. Clock jitter suppression is the same as for the CT DS modulation mentioned above. The effects of output-rail variations on the output load can also be compensated by making the biased-transistor current a function of the difference between the two output rails.

Some specific embodiments of the present invention are further described to facilitate an understanding of the ways in which the invention may be realized and practiced. The examples can be considered as the preferred embodiments as they are discovered to function well in the practice of the invention. However, it should be appreciated that many changes can be made in the following exemplary embodiments while still obtaining like or similar results without departing from the spirit of the invention. Accordingly, the following embodiments should not be considered as limitations on the present invention.

ADC 112 and DAC 113 in a CT DS modulator shown in FIG. 1 can be multibit or single-bit. For the sake of simplicity, in the following embodiments single-bit version of them is considered. However, those skilled in the art will appreciate that the present invention can be used in both single-bit and multibit CT DS modulator. Moreover, although the present invention could be realized in BJT, CMOS and other technologies, the embodiments below are implemented in CMOS technology.

Figure 4:
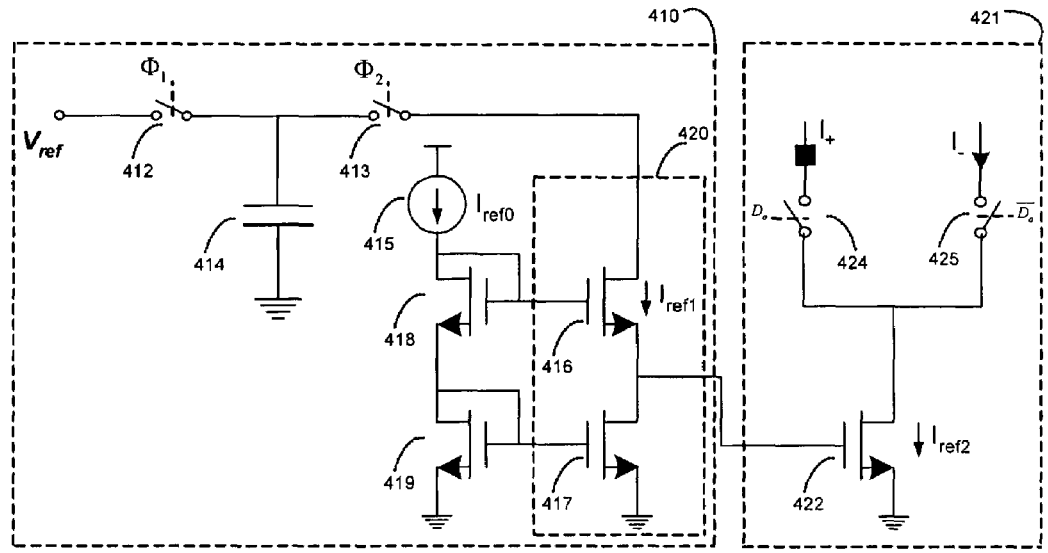
FIG. 4 shows a circuit diagram of a technique to suppress clock-jitter in a DAC of a CTDS using a switched-current block according to a first embodiment of the present invention.

FIG. 4 shows a first embodiment of the invention that can be used to replace the DAC 113 of the CT DS modulator in FIG. 1. In this embodiment, a switched-current DAC has been preferred in the realization as it is largely used in CT DS modulators. A control block 410 provides a control current $I_{ref2}$ for controlling a switched-current block 421. Block 410 includes a capacitor 414, coupling switches 412, 413, NMOS transistors 416, 417, 418, 419 and a current source 415. The sampling clock of the CT DS modulator in FIG. 1 has two phases $\Phi_1$ and $\Phi_2$. During the first phase, $\Phi_1$, the capacitor 414 is charged to a reference signal $V_{ref}$ via the switch 412 which is controlled as a function of $\Phi_1$. The size of the switch 412 and the capacitor 414 should be chosen such that the capacitor 414 is charged to a level beyond which clock jitter will not decrease the desired SNDR of the modulator.

During the second phase, $\Phi_2$, via a switch 413 controlled as a function of $\Phi_2$, the capacitor 414 is discharged through a transistor 417 which is cascoded by a transistor 416. This cascode tail 420 in parallel with a tail of two diode-connected transistors 418 and 419 and a current-source 415 constitute a cascode current-mirror. As it is shown in FIG. 4, the transistors 416 and 417 are biased such that in saturation region, their drain-to-source currents $I_{ref1}$ is a multiple of the current ($I_{ref0}$) of the current-source 415. At the start of the discharging of the capacitor 414 at the second phase, (2, the transistors 416 and 417 are in saturation region and remain in this mode until the voltage across the capacitor, which is linearly decreasing, meets the saturation voltage of the tail 420. After that, the cascode tail 420 will go to the triode region and exponentially discharge the capacitor 414.

To produce the output current of the DAC, a switched-current block 421 is used. To mirror and sense the current of the tail 420, a transistor 422 is used in which its gate is coupled to the source of the transistor 416. The transistor 422 acts as a mirror transistor of the transistors 417 or 419. During the saturation mode of the cascode tail 420, the transistor 422's current (Iref2) is a multiple of the Iref0 or Iref1. When the cascade tail 420 starts to go to its triode region, the transistor 422 starts to turn off causing its current Iref2 to drop off to zero. The current Iref2 is used as a reference current for the switched-current block 421. The realization of the switched-current block 421 could be different. For the sake of simplicity, in FIG. 4, a simple single-ended version of a switched-current circuit is realized. Having the transistor 422 as the current reference, the output analogue signals (I+ and I−) are produced as a function of the digital signal Do using switches 424 and 425 which are working as a function of Do. In the case of a CT DS modulator, the output analogue signals (I+ and I−) of the present embodiment feed to the loop-filter 111 as the signal Ud in FIG. 1.

Figure 5:
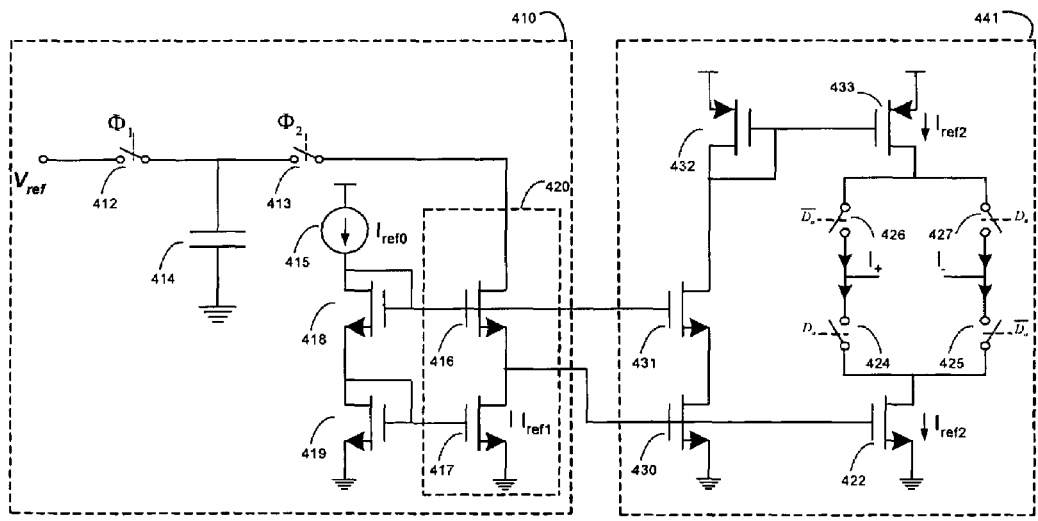
FIG. 5 shows a circuit diagram of a technique to suppress clock-jitter using a fully differential switched-current block according to a second embodiment of the present invention.

FIG. 5 shows a second embodiment of the invention. Similar parts to those of FIG. 4 are denoted by the same reference numeral. In FIG. 5, a fully differential switched-current block 441 is employed, which is commonly used in CT DS modulators. Via a tail consisting of the transistors 430, 431 and 432, the current Iref2 is mirrored to a transistor 433 which is the differential pair of the transistor 422. Having the transistors 422 and 433 as the current references, the output analogue signals (I+ and I−) are produced as a function of the digital signal Do using switches 424, 425, 426 and 427 which are working as a function of Do. In the case of CT DS modulator, the output analogue signals (I+ and I−) of the present embodiment feed to the loop-filter 111 as the signal Ud in FIG. 1.

As shown in FIG. 3, the embodiment's output analogue-current 313 is a pulse shape as expected. The pulse amplitude of this analogue current ($I_n$) is slightly bigger than $I_r$ from the ordinary switched-current DAC since the integral of them undertaken at the second phase should be the same. The size of the capacitor 414, the analogue reference voltage $V_{ref}$, the current reference 415, the cascode current mirror's transistors (416, 417, 418, 419) and the switches 412, 413 should be set properly to ensure that the output current 313 falls sufficiently before the clock transition so that the variation of the clock transition (clock jitter) has a minimal effect on the integral of the analogue output current $I_{ref2}$ undertaken at the second phase.

Figure 6:
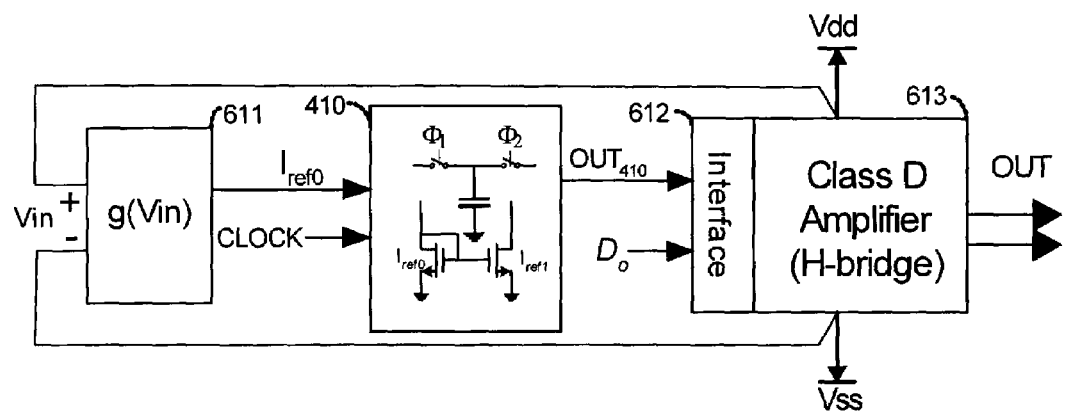
FIG. 6 shows a block diagram of a technique to suppress clock-jitter and output-rails variations of a class D amplifier according to a third embodiment of the present invention.

FIG. 6 shows a block diagram of a third embodiment of the invention including a class D amplifier. The block 410 in FIG. 6 is similar to block 410 of FIGS. 4, 5. The only difference between the block 410 in FIG. 6 with the one in FIG. 5 is that here the reference current $I_{ref0}$ is not constant and comes from the feedback made directly proportional to the difference between the two output rails of the class D amplifier (either single-ended or double-ended). The output of block 410 and the digital input signal $D_0$ enter to the interface block 612 which drives the class D amplifier, 613. The output of block 613 is switched between the two reference voltages. For low-voltage low-power applications like hearing-aid devices, the output rails are the power supply and the ground terminals. In FIG. 6, these two rails are Vdd and Vss. Because of switching the output load between these two rails, Vdd and Vss are contaminated with some unwanted variations. As the output power is directly proportional to the difference between these two rails, these deviations decrease the accuracy and precision of the amplifier. To reduce these affects and more importantly bring the nonlinear system to its linear region, the feedback block diagram 611 is located to produce the reference current $I_{ref0}$ as a function of the difference between Vdd and Vss. This current is fed to the block 410 to be used as the reference current.

Figure 7:
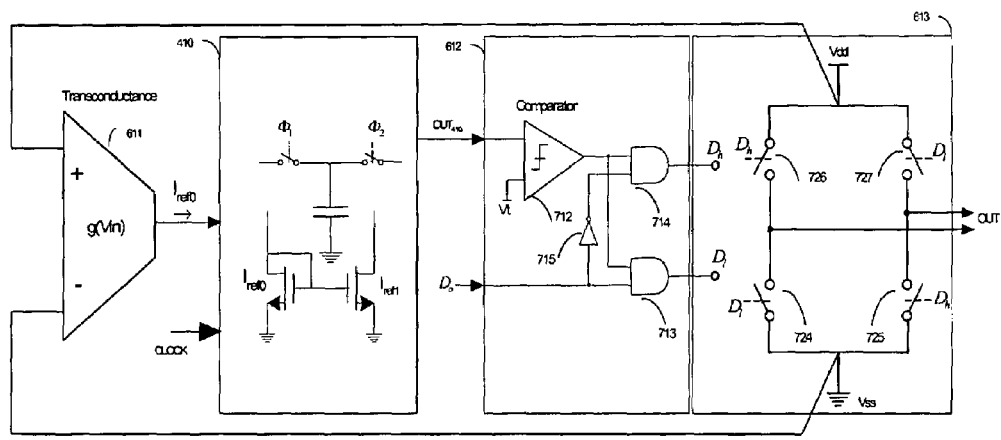
FIG. 7 is a further block diagram of the third embodiment of FIG. 6, showing exemplary circuit implementations.

Referring to FIG. 7, this shows a further block diagram of the third embodiment of the invention including a class D amplifier, showing exemplary circuit implementations, and similar parts to those of FIG. 6 are denoted by the same reference numeral. The block 410 in FIG. 7 is similar to block 410 of FIGS. 4, 5 and 6. Similar to block 410 in FIG. 6, the reference current $I_{ref0}$ in block 410 in FIG. 7 is not constant and comes from the feedback made directly proportional to the difference between the two output rails $V_{dd}$, $V_{ss}$ of the class D amplifier using transconductance amplifier 611. The analogue output OUT of block 410 enters to the interface block 612 and is digitised by a comparator 712. This digitised signal and the digital input signal $D_0$ generate the class D amplifier's input drives, $D_i$, $D_h$ using AND and NOT gates 713, 714 and 715. Class D block 613 in FIG. 7 is an H-bridge, a simple exemplary realization of the class D amplifier block 613 in FIG. 6 (other realisations are possible, for example a push-pull arrangement). The H-bridge comprises four switches 724, 725, 726 and 727 with the control digital inputs $D_i$ and $D_h$ coming from block 612. The output load of this H-bridge, 613, is switched between the two reference voltages (here Vdd and Vss). Similar to FIG. 6, to reduce the effects of supply voltage variations and contaminations, transconductance amplifier 611 is arranged to produce the reference current $I_{ref0}$ as a function of the difference between Vdd and Vss. This current is fed to the block 410 to be used as the reference current.

The Class D amplifier may be double ended, in the sense that it is fully differential and has double output nodes, or single ended, with a single output node.

In the above embodiments, the clock signal should at least have two phases. The terms "first phase" and "second phase" of the clock signal, as used herein, does not imply that the clock signal of the circuit must have only two phases.

The invention claimed is:

1. An apparatus for digital to analogue conversion of an input signal ($D_o$) to an output signal ($U_d$, OUT) comprising:
    a control circuit comprising:
        a capacitor coupled to a switch circuit for charging said capacitor to a reference voltage value ($V_{ref}$) during a first phase ($\phi_1$) of a clock signal, and for discharging said capacitor through a discharge circuit during a second phase ($\phi_2$) of said clock signal, said discharge circuit regulating a discharge of said capacitor to produce a control discharge current,
        wherein said discharge circuit provides a discharge path including a discharge transistor, wherein a voltage across said capacitor determines an operating mode of said discharge transistor such that in said second phase said discharge transistor operates in a first mode to provide an approximately constant discharge current, and subsequently operates in a second mode for discharging said capacitor before an end of said second phase; and
    an output circuit coupled to receive said input signal ($D_o$), and coupled to said control circuit, for responding to said control discharge current for producing said output signal ($U_d$, OUT) as a function of said control discharge current and said input signal ($D_o$).

2. The apparatus as claimed in claim 1,
    wherein said discharge transistor further comprises a CMOS transistor, and
    wherein in said first mode said CMOS transistor is in its saturation region with a desired current ($I_{ref1}$), and in said second mode is in its triode region.

3. The apparatus as claimed in claim 1, further comprising a bias circuit coupled to a gate of said discharge transistor, including a reference source of current coupled to a main current path of a current mirror transistor circuit that is coupled to bias said discharge transistor.

4. An apparatus for digital to analogue conversion of an input signal ($D_o$) to an output signal ($U_d$, OUT) comprising:
    a control circuit comprising:
        a capacitor coupled to a switch circuit for charging said capacitor to a reference voltage value ($V_{ref}$) during a first phase ($\phi_1$) of a clock signal, and for discharging said capacitor through a discharge circuit during a second phase ($\phi_2$) of said clock signal, said discharge circuit regulating a discharge of said capacitor to produce a control discharge current,
        wherein said discharge circuit provides a discharge path including a discharge transistor, wherein a voltage across said capacitor determines an operating mode of said discharge transistor such that in said second phase said discharge transistor operates in a first mode to provide an approximately constant discharge current, and subsequently operates in a second mode for discharging said capacitor before an end of said second phase; and
    an output circuit coupled to receive said input signal ($D_o$), and coupled to said control circuit, for responding to said control discharge current for producing said output signal ($U_d$, OUT) as a function of said control discharge current and said input signal ($D_o$),
    wherein said output circuit is a switched current circuit including first and second switches respectively controlled by said input signal $D_0$ and its inverse $\overline{D}_0$, and including an output transistor circuit coupled to said discharge transistor in a current mirror configuration, for providing an output current to said first and second switches.

5. The apparatus as claimed in claim 4, further comprising third and fourth switches respectively controlled by said input signal $D_0$ and its inverse $\overline{D}_0$, and connected to said first and second switches in a bridge configuration, and including second output transistor circuit coupled to said discharge transistor in a current mirror configuration, for providing an output current to said third and fourth switches.

6. An apparatus for digital to analogue conversion of an input signal ($D_o$) to an output signal ($U_d$, OUT) comprising:
    a control circuit comprising:
        a capacitor coupled to a switch circuit for charging said capacitor to a reference voltage value ($V_{ref}$) during a first phase ($\phi_1$) of a clock signal, and for discharging said capacitor through a discharge circuit during a second phase ($\phi_2$) of said clock signal, said discharge circuit regulating a discharge of said capacitor to produce a control discharge current.

wherein said discharge circuit provides a discharge path including a discharge transistor, wherein a voltage across said capacitor determines an operating mode of said discharge transistor such that in said second phase said discharge transistor operates in a first mode to provide an approximately constant discharge current, and subsequently operates in a second mode for discharging said capacitor before an end of said second phase; and an output circuit coupled to receive said input signal ($D_o$), and coupled to said control circuit, for responding to said control discharge current for producing said output signal ($U_d$, OUT) as a function of said control discharge current and said input signal ($D_o$), wherein said output circuit is a Class D amplifier circuit.

7. The apparatus as claimed in claim 6, wherein said class D amplifier circuit comprises a drive circuit for driving an output load, and including first and second reference voltages ($V_{dd}$, $V_{ss}$) for energizing said drive circuit, wherein a difference between said first and second reference voltages is arranged to control a reference source of current, said reference source of current controlling said discharge transistor.

8. The apparatus as claimed in claim 7, wherein said difference between said first and second reference voltages is applied to a transconductance amplifier circuit for providing a reference current ($I_{ref0}$), said reference current being coupled to a bias circuit for biasing said discharge transistor.

9. The apparatus as claimed in claim 6, wherein said class D amplifier circuit comprises an interface circuit and a drive circuit, said interface circuit being coupled to receive said input signal ($D_o$), and a discharge current signal, and including a circuit for digitizing and comparing said discharge current signal with said input signal to provide control signals ($D_h$, $D_l$) for said drive circuit.

10. The apparatus as claimed in claim 1,
wherein said apparatus forms a digital to analogue converter incorporated in a feed back loop of a Delta Sigma converter,
wherein said input signal ($D_o$) is an input to said digital to analogue converter, and said output signal ($U_d$, OUT) is an output of said digital to analogue converter,
wherein said Delta Sigma converter comprises a filter coupled for receiving an input analog signal ($U_i$) and said output signal ($U_d$, OUT), and an output of said filter being coupled to a quantiser circuit that provides an output signal that constitutes said input signal ($D_o$).

* * * * *